United States Patent [19]

Debus et al.

[11] Patent Number: 4,878,777
[45] Date of Patent: Nov. 7, 1989

[54] SOCKET FOR A CONTROL PANEL

[75] Inventors: Jürgen Debus, Dietzhólztal; Lothar Lehr, Oberdresselndorf, both of Fed. Rep. of Germany

[73] Assignee: Rittal-Werk, Herborn, Fed. Rep. of Germany

[21] Appl. No.: 168,374

[22] Filed: Mar. 15, 1988

[30] Foreign Application Priority Data

Mar. 30, 1987 [DE] Fed. Rep. of Germany ....... 3720576

[51] Int. Cl.$^4$ .............................................. F16B 1/00
[52] U.S. Cl. .................................. 403/205; 403/234; 403/403
[58] Field of Search ........................ 403/403, 231, 205

[56] References Cited

U.S. PATENT DOCUMENTS 4,347,015 8/1982 Ohshaw .......................... 403/231 X

FOREIGN PATENT DOCUMENTS 3412291 4/1986 Fed. Rep. of Germany .

Primary Examiner—Andrew V. Kundrat
Attorney, Agent, or Firm—Peter N. Jansson

[57] ABSTRACT

This invention concerns an improved socket for a control panel of the type having four angled corner pieces, at least two transverse recess members and at least two longitudinal recess members forming a frame. Dimensional stability and torsional rigidity of the socket are greatly increased due to the fact that vertical connecting flanges are bent at right angles along the free edges of the panel-mounting flanges at least in the area of the vertical mounting flanges for mounting of the transverse recess member, and such connecting flanges are connected to the recess-member mounting flanges when the transverse recess members are installed.

11 Claims, 1 Drawing Sheet

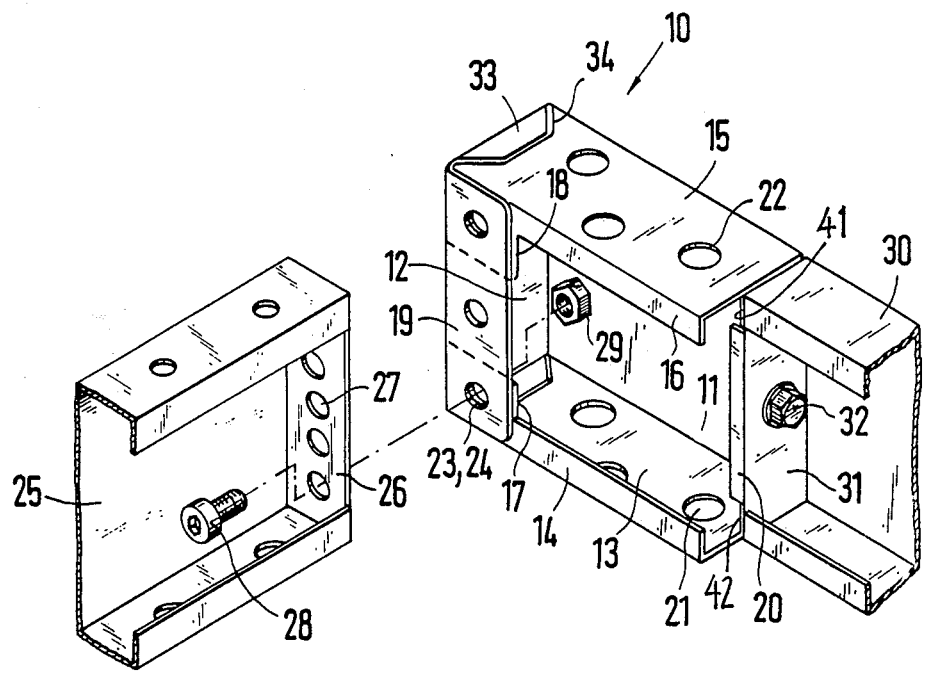

SOCKET FOR A CONTROL PANEL

FIELD OF THE INVENTION

This invention is related to sockets for a control panel of the type having four angled corner pieces, at least two longitudinal recess members and at least two transverse recess members joined together to form a frame. In such devices, the corner pieces have two vertical outside walls at right angles to each other, vertical flanges for recess-member mounting which are along the free vertical edges of the outside walls and have recess-member mounting boreholes, and horizontal panel-mounting flanges which are along the horizontal edges of the outside wall in surface-to-surface relationship with the longitudinal recess member. The panel-mounting flanges are bent at right angles and have panel-mounting boreholes permitting the box-shaped transverse and longitudinal recess members to be connected to the flanges for recess-member mounting with the corner pieces in a manner such that they are flush with the outside surfaces of the corner pieces.

BACKGROUND OF THE INVENTION

Such sockets are known from German Patent No. 3,412,291 and have the advantage that the transverse and longitudinal recess members and the corner pieces can easily be assembled and dismantled as a set. It has now been found that, especially in large heavy control panels, the socket does not have the required stability in the area of the corner pieces. The two vertical outside walls of the corner piece do not retain their right-angle relationship, and the panel-mounting flanges also slip out of horizontal alignment under load. This results in deformation of the socket so that a definite mounting plane is no longer provided for the control panel nor is there even a definite installation plane.

OBJECT OF THIS INVENTION

The object of this invention is to create a socket of the type defined initially so that it will have a much greater stability and torsional strength due to simple measures at the corner pieces.

SUMMARY OF THE INVENTION

This objective is achieved in accordance with this invention by the fact that, at least in the area of the vertical mounting flanges for the transverse recess members, there are vertical connecting flanges that are bent at a right angle along the free edges of the horizontal panel-mounting flanges and these vertical connecting flanges can be connected to the recess-member mounting flanges when the transverse recess members are attached.

Since the panel-mounting flanges are connected to the recess-member mounting flanges, a stable hollow body is created such that not only are the outside walls of the corner pieces securely fixed relative to each other but the horizontal panel-mounting flanges are secured in their orientations with respect to the outside walls and these do not change even under large irregular loads. The corner pieces are not made more expensive by this invention. The vertical connecting flanges can easily be provided in the proper place in manufacturing the corner pieces by punching and bending operations, so they can then be connected to the recess-member mounting flanges in attachment of the transverse recess members with the mounting screws. To do so, it is sufficient for each of the vertical connecting flanges to be provided with at least one connecting orifice which is aligned with a borehole of the facing recess-member mounting flange.

These screw connections are easier and simpler to produce if the connecting orifices are designed as threaded boreholes for mounting screws and/or if nuts are affixed to the sides of the connecting flanges which face away from the recess-member mounting flanges in alignment with the connecting orifices.

In order for the corner pieces to be designed so they are symmetrical as in the past, another version provides that the vertical connecting flanges extend only over a part of the height of the recess-member mounting flanges which is equal to or less than half the height of the socket, and that the respective connecting flanges of a corner piece have the same dimensions.

Access to the screw connections in the corner piece is facilitated by the fact that the horizontal dimensions of the recess-member mounting flanges and the vertical connecting flanges are equal.

To reinforce the horizontal panel-mounting flanges, another feature of this invention provides that the horizontal panel-mounting flanges be reinforced with reinforcing flanges each having a right angle bend beyond the area of the vertical connecting flanges so that the vertical dimensions of the reinforcing flanges are smaller than the vertical dimensions of the vertical connecting flanges.

The outside wall of the corner piece apart from the horizontal panel-mounting flange can be reinforced by providing the horizontal panel-mounting flanges with recesses for horizontal reinforcing flanges bent at right angles to the outside wall of the corner piece which is beside the transverse recess member. Such recesses in the horizontal panel-mounting flanges create room for this reinforcing flange.

BRIEF DESCRIPTION OF THE DRAWING

The drawing is an exploded perspective view of a preferred embodiment of this invention.

DETAILED DESCRIPTION OF PREFERRED EMBODIMENT

This invention will now be described in greater detail by reference to a preferred embodiment which is illustrated in the drawing.

The main piece of the socket of this invention is a corner piece 10 which is manufactured by punching the shape out of a sheet of material and then bending it. The two vertical outside walls 11 and 12 of corner piece 10 are at right angles to each other. The vertical mounting flanges 19 and 20 are bent inwardly along the free vertical edges of outside walls 11 and 12. Mounting flanges 19 and 20 have boreholes 23 as illustrated for recess-member mounting.

Horizontal panel-mounting flanges 13 and 15 can be bent inward at right angles along the horizontal edges of outside wall 11 adjacent to a longitudinal recess member 30. Panel-mounting flanges 13 and 15 have panel-mounting boreholes 21 and 22 by means of which the socket can be connected to the control panel, preferably by bolting.

The sides of the horizontal panel-mounting flanges 13 and 15 facing outside wall 12 have recesses 34 for horizontal reinforcing flanges 33 which are bent inwardly at right angles along the horizontal edges of outside wall 12.

Horizontal panel-mounting flanges 13 and 15 are provided with vertical connecting flanges 17 and 18 which are bent inwardly at right angles in the area of vertical mounting flange 19 for mounting transverse recess member 25. Vertical connecting flanges 17 and 18, like the narrower reinforcing flanges 14 and 16, are angled along the free edges of horizontal panel-mounting flanges 13 and 15.

Vertical connecting flanges 17 and 18 each have at least one connecting orifice 24 which is aligned with an borehole 23 of vertical mounting flange 19. If box-like transverse recess member 25 is connected to corner piece 10, then the mounting bolts 28 pass through boreholes 27 of mounting flange 26 of transverse recess member 25, boreholes 23 of vertical mounting flange 19, and connecting orifices 24 which are in vertical connecting flanges 17 and 18. These bolts are secured with nuts 29. Then horizontal panel-mounting flanges 13 and 15 are stabilized by vertical mounting flange 19 and are permanently secured in their horizontal positions. Furthermore, horizontal panel-mounting flanges 13 and 15 stabilize two outside walls 11 and 12 in their positions by means of vertical mounting flange 19. Corner piece 10 then has a much greater stability and torsional rigidity which is transferred completely to the socket.

In the same way, vertical mounting flange 20 can be connected to the horizontal panel-mounting flanges 13 and 15 by upper and lower vertical end flanges 41 and 42. Mounting bolts 32 connect vertical end flanges 41 and 42, which are bent at right angles from the horizontal panel-mounting flanges 13 and 15, respectively, to vertical mounting flange 20 of corner piece 10 and mounting flange 31 of box-like longitudinal recess member 30.

The drawing also represents variations in orfices 24 and the manner of connection. Assembly and dismantling of the socket are facilitated and simplified if connecting orifices 24 of vertical connecting flanges 17 and 18 or 20 are designed as threaded boreholes, as may be the case in the illustrated embodiment. Then nuts 29 can be eliminated. However, as also illustrated nuts 29 can also be affixed to vertical connecting flanges 17 and 18 (that is, on the side of vertical connecting flanges 19 which faces away from vertical mounting flange 19) in the area of connecting orifices 24. Nuts 29 are aligned with connecting orifices 24 of vertical connecting flanges 17 and 18.

The increased stability and torsional rigidity of corner pieces 10 of the socket is achieved merely by the additional connecting flanges that complete corner piece 10 to form a stable hollow body in the installed state, while still using starting material of the same thickness.

While the principles of this invention have been described in connection with specific embodiments, it should be understood clearly that these descriptions are made only by way of example and are not intended to limit the scope of the invention.

We claim:

1. In a socket for a control panel of the type having four corner pieces and at least two longitudinal and two transverse box-like recess members connected to form a frame, in which each corner piece has: two vertical outside walls at right angles to each other; vertical mounting flanges along the free vertical edges of the outside walls, said vertical mounting flanges having boreholes; and horizontal panel-mounting flanges along the horizontal edges of, and bent at right angles to, the outside wall and adjacent to the longitudinal recess member, the panel-mounting flanges having panel-mounting boreholes and free edges; and the box-shaped recess members being connected to the vertical mounting flanges such that they are aligned with said outside walls, the improvement in the corner pieces comprising:

vertical connecting flanges (17, 18) bent at substantially right angles to, and along the free edges of, the horizontal panel-mounting flanges (13, 15) at least in the area of the vertical mounting flange (19), whereby said vertical connecting flanges are connected to the vertical mounting flange (19) in attachement of said corner piece to said transverse recess member (25).

2. The socket of claim 1 wherein the vertical connecting flanges (17, 18) each have at least one connecting orifice (24) aligned with one of said boreholes (23) in the vertical mounting flange (19) adjacent to it.

3. The socket of claim 2 wherein the connecting orifices are threaded for engagement with mounting screws (28).

4. The socket of claim 2 further comprising nuts (29) affixed to said vertical connecting flanges (17, 18) on the sides thereof away from the vertical mounting flange (19) and in alignment with the connecting orifice (24).

5. The socket of claim 1 wherein the vertical connecting flanges (17, 18) extend over only a part of the height of the vertical mounting flange (19), said part being no more than half the height of the socket.

6. The socket of claim 5 wherein the vertical mounting flanges (19) and the connecting flanges (17, 18) have the same horizontal dimensions.

7. The socket of claim 6 wherein the horizontal panel-mounting flanges (13, 15) are reinforced beyond the vertical connecting flanges (17, 18) with reinforcing flanges (14, 16) which are at right angles to horizontal panel-mounting flanges 13 and 15, said reinforcing flanges having vertical dimensions smaller than the vertical dimensions of the vertical connecting flanges (17, 18).

8. The socket of claim 1 wherein the horizontal panel-mounting flanges (13, 15) have recesses (34) receiving horizontal reinforcing flanges (33) bent at right angles from the outside wall (12) of the corner piece (10) which is adjacent to the transverse recess member (25).

9. The socket of claim 1 further comprising upper and lower vertical end flanges (41, 42) along, and bent at right angles to, the horizontal panel-mounting flanges (13, 15) adjacent to the longitudinal recess member (30), said upper and lower vertical end flanges being attached to the adjacent vertical mounting flange (20) and to a mounting flange (31) of longitudinal recess member (30).

10. The socket of claim 4 further comprising upper and lower vertical end flanges (41, 42) along, and bent at right angles to, the horizontal panel-mounting flanges (13, 15) adjacent to the longitudinal recess member (30), said upper and lower vertical end flanges being attached to the adjacent vertical mounting flange (20) and to a mounting flange (31) of longitudinal recess member (30).

11. The socket of claim 6 further comprising upper and lower vertical end flanges (41, 42) along, and bent at right angles to, the horizontal panel-mounting flanges (13, 15) adjacent to the longitudinal recess member (30), said upper and lower vertical end flanges being attached to the adjacent vertical mounting flange (20) and to a mounting flange (31) of longitudinal recess member (30).

* * * * *